(12) United States Patent
Knecht et al.

(10) Patent No.: US 7,940,148 B2
(45) Date of Patent: May 10, 2011

(54) BALL GRID ARRAY RESONATOR

(75) Inventors: Thomas A. Knecht, Dundee, IL (US); Glen Reeser, Palatine, IL (US)

(73) Assignee: CTS Corporation, Elkhart, IN (US)

( * ) Notice: Subject to any disclaimer, the term of this patent is extended or adjusted under 35 U.S.C. 154(b) by 438 days.

(21) Appl. No.: 11/980,181

(22) Filed: Oct. 30, 2007

(65) Prior Publication Data

US 2008/0106356 A1 May 8, 2008

Related U.S. Application Data

(60) Provisional application No. 60/856,064, filed on Nov. 2, 2006.

(51) Int. Cl.
H01P 7/08 (2006.01)
(52) U.S. Cl. ........................................ 333/219
(58) Field of Classification Search .......... 333/165, 333/166, 175, 176, 185, 195, 202–204, 219, 333/234, 238
See application file for complete search history.

(56) References Cited

U.S. PATENT DOCUMENTS

| | | |
|---|---|---|
| 4,431,977 A | 2/1984 | Sokola et al. |
| 4,551,696 A | 11/1985 | Moutrie et al. |
| 4,609,892 A | 9/1986 | Higgins, Jr. |
| 4,785,271 A | 11/1988 | Higgins, Jr. |
| 4,940,955 A | 7/1990 | Higgins, Jr. |
| 4,963,843 A | 10/1990 | Peckham |
| 5,057,803 A | 10/1991 | Ooi et al. |
| 5,153,542 A | 10/1992 | Tai et al. |
| 5,160,905 A | 11/1992 | Hoang |
| 5,160,906 A | 11/1992 | Siomkos et al. |
| 5,349,315 A | 9/1994 | Ala-Kojola |
| 5,357,218 A * | 10/1994 | Wingfield et al. .......... 331/96 |
| 5,376,908 A * | 12/1994 | Kawaguchi et al. ........ 333/203 |
| 5,416,454 A | 5/1995 | McVeety |
| 5,486,799 A | 1/1996 | Komazaki et al. |
| 5,487,211 A | 1/1996 | Haas et al. |
| 5,642,265 A | 6/1997 | Bond et al. |
| 5,717,245 A | 2/1998 | Pedder |

(Continued)

FOREIGN PATENT DOCUMENTS

EP  0 675 539 A  10/1995

(Continued)

OTHER PUBLICATIONS

Pergola L. et al: "An LTCC-based 5-6 GHz Receiver with Integrated Antenna", 7th European Conference on Wireless Technology, 2004, Amsterdam, The Netherlands; Oct. 11-12, 2004, Piscataway, NJ, USA IEEE, Oct. 11, 2004, pp. 165-168, XP010771265 ISBN: 1-58053-991-2.

(Continued)

Primary Examiner — Benny Lee
Assistant Examiner — Gerald Stevens
(74) Attorney, Agent, or Firm — Daniel J. Deneufbourg

(57) ABSTRACT

A ball grid array ceramic resonator including a substrate having one or more strips of conductive material on opposed first and second surfaces of the substrate. One or more conductive vias extend through the substrate and define termination ends in the respective substrate surfaces. In one embodiment, a plurality of conductive spheres/balls defining respective ground pads are disposed over the ends of said vias terminating in said one or more strips of conductive material on said first or second surface and another conductive sphere is disposed over one of the strips of conductive material to define an RF signal input pad.

2 Claims, 7 Drawing Sheets

U.S. PATENT DOCUMENTS

| | | |
|---|---|---|
| 5,812,037 A | 9/1998 | Block |
| 5,977,863 A | 11/1999 | Bloom et al. |
| 5,994,978 A | 11/1999 | Vangala |
| 6,005,777 A | 12/1999 | Bloom et al. |
| 6,097,277 A | 8/2000 | Ginn et al. |
| 6,127,906 A * | 10/2000 | Brooks et al. .......... 333/204 |
| 6,194,979 B1 | 2/2001 | Bloom et al. |
| 6,218,729 B1 | 4/2001 | Zavrel, Jr. et al. |
| 6,246,312 B1 | 6/2001 | Poole et al. |
| 6,323,824 B1 | 11/2001 | Heinrichs et al. |
| 6,326,677 B1 | 12/2001 | Bloom et al. |
| 6,326,866 B1 * | 12/2001 | Sasaki et al. .......... 333/203 |
| 6,329,890 B1 | 12/2001 | Brooks et al. |
| 6,362,525 B1 | 3/2002 | Rahim |
| 6,559,735 B1 | 5/2003 | Hoang et al. |
| 6,577,225 B1 | 6/2003 | Poole |
| 6,624,728 B2 * | 9/2003 | Miyazaki et al. .......... 333/204 |
| 6,791,403 B1 | 9/2004 | Tayani et al. |
| 6,825,734 B2 | 11/2004 | Clark |
| 6,856,516 B2 | 2/2005 | Ernsberger et al. |
| 6,882,266 B2 | 4/2005 | Christian et al. |
| 6,897,761 B2 | 5/2005 | Ernsberger et al. |
| 6,900,708 B2 | 5/2005 | White et al. |
| 6,946,733 B2 | 9/2005 | Poole et al. |
| 6,963,265 B2 | 11/2005 | Cooper et al. |
| 7,015,060 B1 | 3/2006 | Kubena et al. |
| 7,068,124 B2 | 6/2006 | White et al. |
| 7,095,372 B2 | 8/2006 | Soler Castany et al. |
| 2004/0000968 A1 | 1/2004 | White et al. |
| 2004/0160283 A1 | 8/2004 | Walter et al. |
| 2005/0190017 A1 | 9/2005 | Hirabayashi |
| 2007/0109076 A1 | 5/2007 | Knecht et al. |

FOREIGN PATENT DOCUMENTS

| | | |
|---|---|---|
| JP | 2003 309483 A | 10/2003 |
| WO | WO 99/41799 | 8/1999 |
| WO | WO 01/95679 A | 12/2001 |

OTHER PUBLICATIONS

Den Otter, Adrianus, PCT International Search Report mailed Jun. 21, 2007 re: International Application No. PCT/US2006/044180 filed Nov. 14, 2006.

Den Otter, Adrianus, PCT Written Opinion of the International Searching Authority mailed Jun. 21, 2007 re: International Application No. PCT/US2006/044180 filed Nov. 14, 2006.

Lark Engineering Company, Surface Mount Combline Filters advertisement, RF Design Magazine, Apr. 2005, p. 7, Penton Media, Park, Kansas, U.S.A.

Von Walter, Sven-Uwe, PCT International Search Report mailed Jul. 28, 2008 re: International Application No. PCT/US2007/022999 filed Oct. 31, 2007.

Von Walter, Sven-Uwe, PCT Written Opinion of the International Searching Authority mailed Jul. 28, 2008 re: International Application No. PCT/US2007/022999 filed Oct. 31, 2007.

* cited by examiner

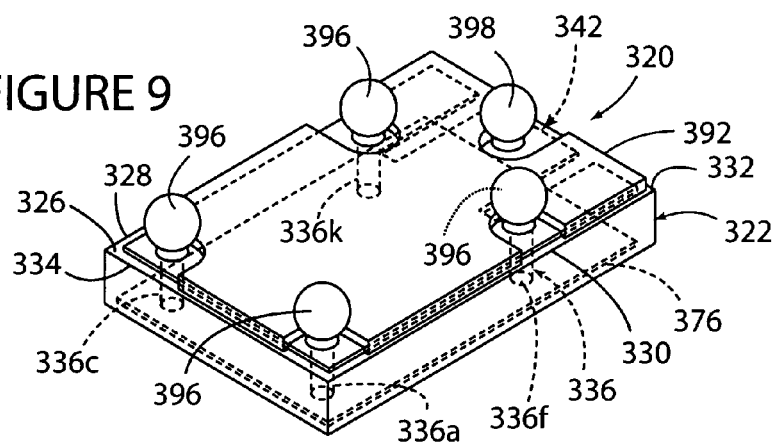
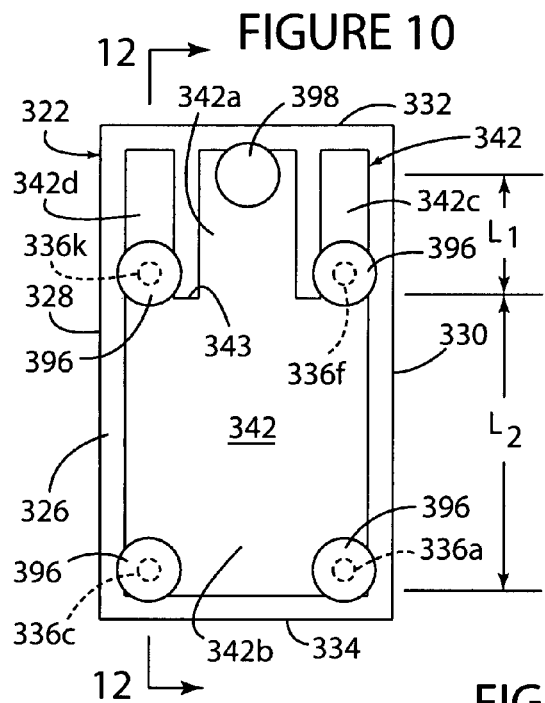
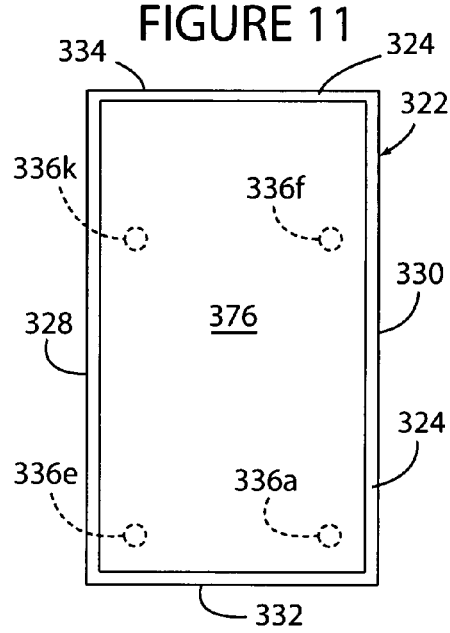
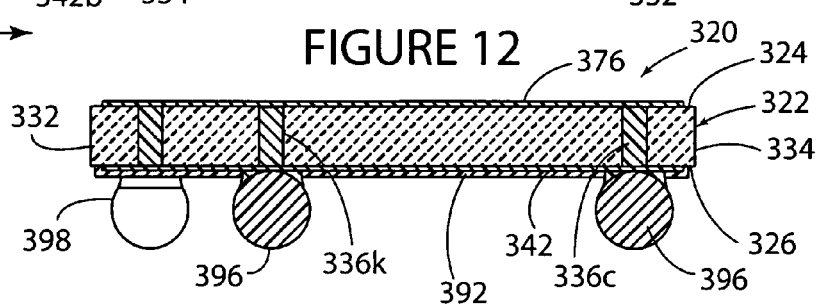

BALL GRID ARRAY RESONATOR

CROSS-REFERENCE TO RELATED APPLICATION

This application claims the benefit of the filing date of U.S. Provisional Application Ser. No. 60/856,064, filed on Nov. 2, 2006, which is explicitly incorporated herein by reference as are all references cited therein.

FIELD OF THE INVENTION

The present invention relates generally to radio frequency (RF) resonators and, more particularly, to an improved direct surface mount, ceramic substrate ball grid array resonator operable in the range of 1.5 GHz or higher.

BACKGROUND OF THE INVENTION

YIG (Yttrium-Iron-Garnet) oscillators, DROs (dielectric resonator oscillators), coaxial resonators, and cavity resonators of the type made and sold by Dielectric Laboratories Inc. of Cazenovia, N.Y., have been in use for the past several years for the purpose of providing precise frequency control references in products such as voltage controlled oscillators.

Although the above devices have gained acceptance in the marketplace, there remains a need for an RF resonator capable of offering selectivity and other performance improvements at 1.5 GHz and higher, all in a lower cost, smaller, higher performance, and lower height ball grid array type package. This invention provides such an improved ceramic ball grid array type resonator.

SUMMARY OF THE INVENTION

The present invention is directed generally to a ball grid array resonator initially comprising a ceramic substrate defining a first surface including one or more strips of conductive material thereon and an opposed second surface with one or more strips of conductive material thereon. At least a first conductive via extends through the substrate and defines respective termination ends in the first and second surfaces and at least a first conductive sphere on one of the first or second surfaces overlies one of the termination ends of the first conductive via and defines a ground pad. At least another conductive sphere on the same surface as the first conductive sphere defines an RF input/output pad.

In one embodiment, the first surface includes at least a first strip of conductive material which extends the full length and width of the substrate and the first conductive via terminates in one of the ends of the first strip of conductive material. The first conductive sphere is seated over the one end of the first strip and overlies the termination end of the first conductive via while the other conductive sphere is seated over the opposed end of the first strip of conductive material.

In another embodiment, the first strip of conductive material has a length and width which is less than the full length and width of the substrate and the ball grid array resonator further comprises a second strip of conductive material which is unitary with one end of the first strip of material and extends along the width of said substrate adjacent one end of the substrate. The first strip of conductive material has a width which is less than the width of the second strip of conductive material and extends outwardly from an interior edge of the second strip of conductive material in the direction of an opposed end of the substrate.

In this embodiment, the termination ends of the first conductive via terminate respectively in the second strip of conductive material and the one or more strips of conductive material on the second surface. The first conductive sphere is seated over the termination end of the first conductive via terminating in the second strip of conductive material and the other conductive sphere is seated over the end of the first strip of conductive material opposite the end unitary with the second strip of conductive material.

The resonator may additionally comprise third and fourth strips of conductive material on the first surface which extend unitarily outwardly from opposed ends of the second strip of conductive material. Each of the third and fourth strips of conductive material extends along the length of the substrate in a spaced-apart and parallel relationship to the first strip of conductive material. A plurality of additional conductive vias may extend through the substrate and define opposed termination ends in the third and fourth strips of conductive material and the one or more strips of conductive material on the second surface. A plurality of third and fourth conductive spheres may also be seated over the termination ends of the vias defined in the third and fourth strips of conductive material respectively.

In accordance with the present invention, the frequency of the ball grid array resonator is increased or decreased by respectively increasing or decreasing the length of the second strip of conductive material on the first surface relative to the length of the first strip of conductive material on the first surface. In one embodiment, the length of the first strip of conductive material on the first surface is greater than or equal to the length of the second strip of conductive material on the first surface. In another embodiment, the length of the first strip of conductive material on the first surface is less than or equal to the length of the second strip of conductive material on the first surface.

The length of the first strip of conductive material on the first surface may define a serpentine pattern to increase the effective length thereof.

The resonator of the present invention is adapted for use in the tank circuit of a VCO or VCO/PLL.

Other advantages and features of the present invention will be more readily apparent from the following detailed description of the preferred embodiment of the invention, the accompanying drawings, and the appended claims.

BRIEF DESCRIPTION OF THE DRAWINGS

In the FIGURES:

FIG. 9 is an enlarged, perspective view of a second "bottom-side" embodiment of a ball grid array resonator in accordance with the present invention;

FIG. 10 is an enlarged, bottom plan view of the resonator of FIG. 9;

FIG. 11 is an enlarged, top plan view of the resonator of FIG. 9;

FIG. 12 is an enlarged, vertical cross-sectional view of the resonator of FIG. 9 taken along the line 12-12 in FIG. 10;

DETAILED DESCRIPTION OF THE EMBODIMENT OF THE INVENTION

While this invention is susceptible to embodiments in many different forms, this specification and the accompanying drawings disclose only respective "top-side" and "bottom-side" embodiments as examples of the present invention. The invention is not intended, however, to be limited to the embodiments so described.

FIGS. 1, 2, 3, 4A, and 4B depict a "top-side" resonator construction or embodiment of a ceramic ball grid array (BGA) microstrip resonator 20 according to the present invention which, in the embodiment shown, measures about 5.0 mm×3.0 mm×1.3 mm (maximum).

Use of the terminology "top-side" is a reference to the fact that the resonator strip pattern 42 described in more detail below is formed on the side of the resonator 20 opposite the side thereof adapted to be seated against, and direct surface mounted to a customer's printed circuit board (not shown).

Figure 1:
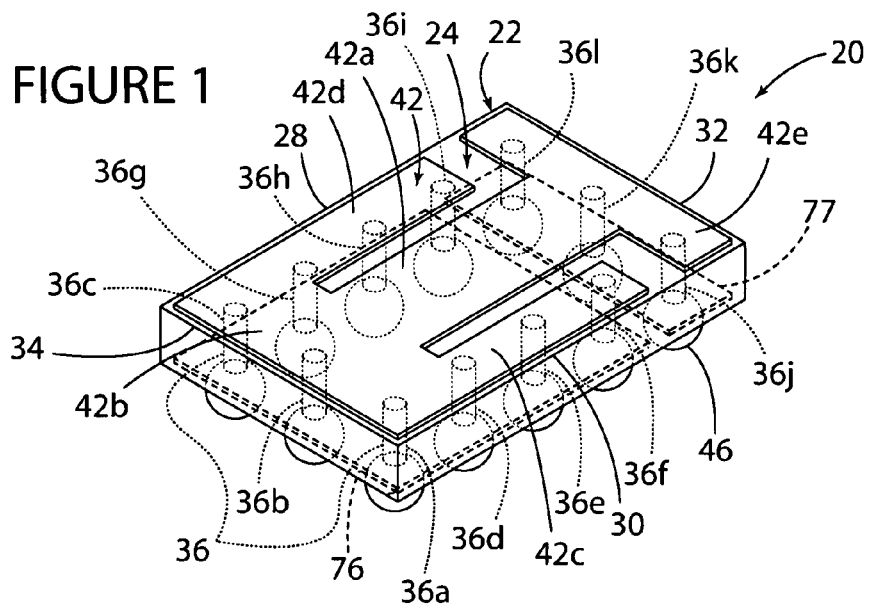
FIG. 1 is an enlarged perspective view of a first "top-side" embodiment of a ball grid array resonator in accordance with the present invention without a lid.
Figure 2:
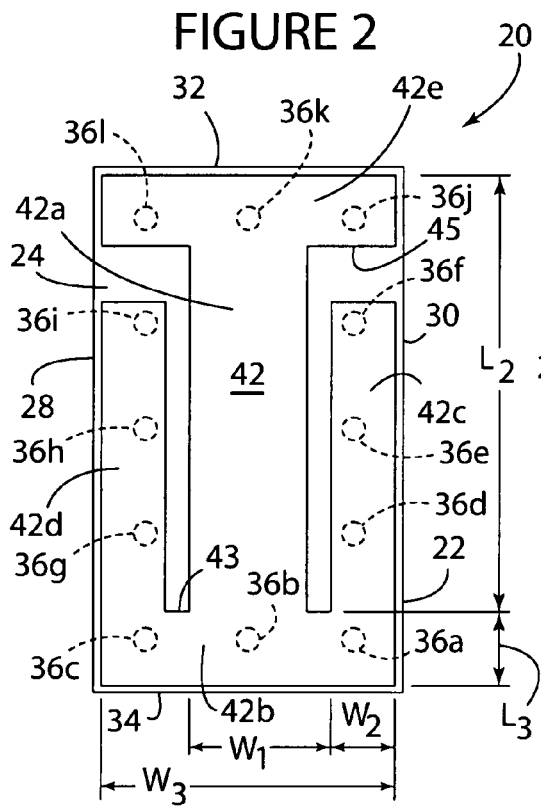
FIG. 2 is an enlarged, top plan view of the resonator of FIG. 1.
Figure 3:
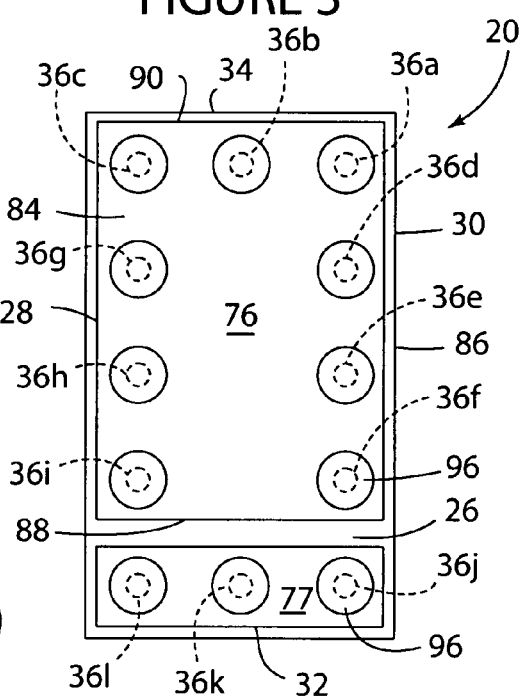
FIG. 3 is an enlarged, bottom plan view of the resonator of FIG. 1.
Figure 4A:
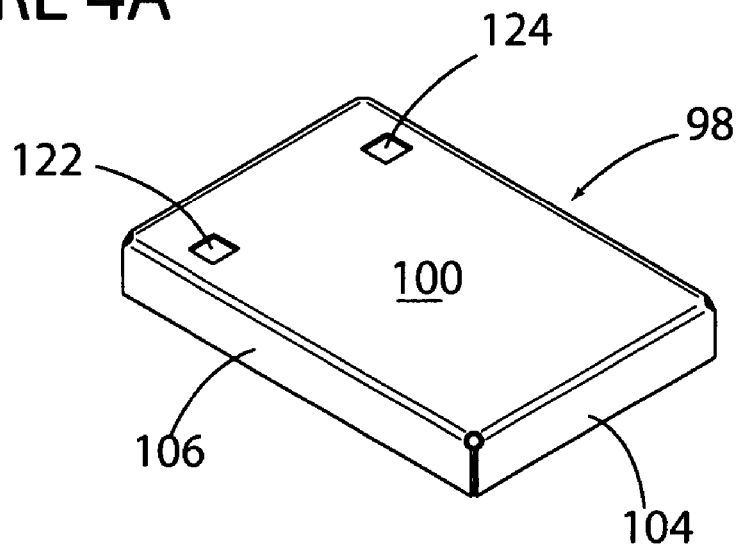
FIGS. 4A and 4B are top and bottom perspective views of the lid adapted to be secured to the top of the resonator of FIG. 1.
Figure 4B:
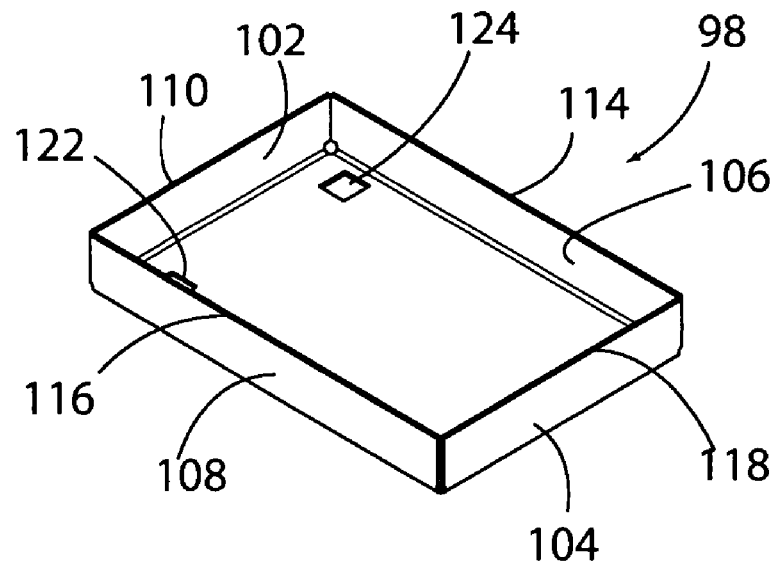

Resonator 20 initially comprises a generally rectangularly-shaped substrate or block 22 composed of any suitable dielectric material that has relatively low loss, a relatively high dielectric constant, and a relatively low temperature coefficient of the dielectric constant. In the embodiment of FIGS. 1-3, substrate 22 measures approximately 5.0 mm×3.0 mm; is about 20 mils (0.5 mm) thick, and is comprised of a ceramic substrate which, in this embodiment, is about 96% aluminum oxide ($Al_2O_3$). In the preferred embodiment, substrate 22 has a Q of between about 200-300 and a dielectric constant (K) of about 9.5.

Substrate 22 includes a top surface 24 (FIG. 2), a bottom surface 26 (FIG. 3), and respective side surfaces defining respective peripheral edges 28, 30, 32, and 34 respectively.

A plurality of generally cylindrically-shaped laser drilled through-holes defining conductive vias 36 (FIGS. 1-3) which, in the embodiment shown, are approximately 8 mils (0.20 mm) in diameter, are formed in and extend generally vertically through the body of substrate 22 between, and in a relationship generally normal to, the top and bottom surfaces 24 and 26. Vias 36 terminate in, and define via termination apertures/ends in both the top and bottom surfaces 24 and 26 respectively of the substrate 22.

Figure 8:
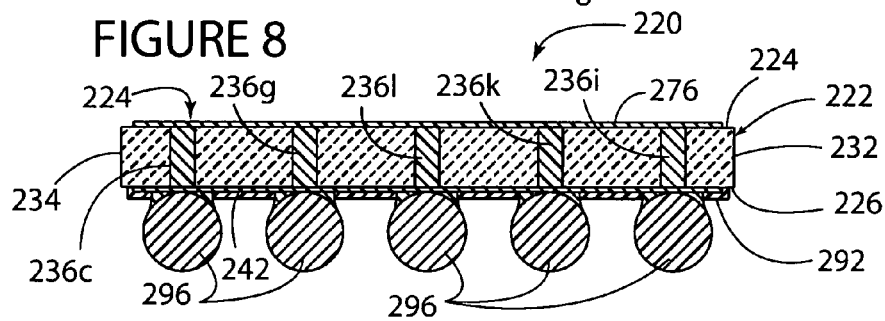
FIG. 8 is an enlarged, vertical cross-sectional view of the resonator of FIG. 5 taken along the line 8-8 in FIG. 7.

As shown in FIG. 8 with respect to resonator embodiment 220, it is understood that the vias are defined by respective through-holes which have been filled with a suitable and conventional thick film conductive via fill material, such as a Ag/Pd (silver/palladium) composition comprising about 99% silver and 1% palladium; having a conductivity of about $4.3 \times 10^7$ mho/cm; a resistivity of about 2.3 µohm-cm; and a sheet resistance of about 2.2 ohm/square.

The top surface 24 of resonator 20 additionally includes a conductive metallization resonator pattern 42 (FIGS. 1 and 2) defined by a plurality of unitary resonator strips which have been formed on the top surface 24 of substrate 22 by any suitable technique including, but not limited to, conventional thick film conductor processing techniques or conventional ablation techniques. Each of the resonator strips is likewise comprised of a suitable and conventional Ag/Pd conductive thick film material similar in composition to the material in vias 36.

In the embodiment shown in FIGS. 1 and 2, pattern 42 is composed of, and defined by, five unitary resonator strips 42a, 42b, 42c, 42d, and 42e as described in more detail below.

Center body resonator strip 42a is generally rectangularly-shaped, is centrally located on the top substrate surface 24 between and parallel to long side substrate edges 28 and 30, and extends between the short side substrate edges 32 and 34 in a relationship generally normal thereto.

Elongate body resonator strip 42a defines a first pair of shoulders defining a generally rectangularly-shaped base or shoulder resonator strip 42b extending unitarily outwardly from one of the ends of center body strip 42a in a relationship generally transverse or normal to the body strip 42a. Base resonator strip 42b is spaced from, and extends in a direction generally parallel to, the substrate short side edge 34. Base resonator strip 42b defines a transverse inner edge or face 43 (FIG. 2) extending in an orientation generally parallel to substrate short side edges 32 and 34 respectively. The strips 42a and 42b in combination define a generally "T"-shaped resonator strip or pattern.

A pair of elongate, generally rectangularly-shaped arm/wing resonator strips 42c and 42d extend unitarily normally outwardly from the opposed ends of the shoulder/base strip 42b in the direction of the substrate short side edge 32. Arms/wings 42c and 42d are spaced from, and extend in a parallel relationship to, both the respective substrate long side edges 28 and 30 and the center body resonator strip 42a. Wing strip 42c is located between and spaced from center strip 42a and substrate side edge 30. Wing strip 42d is located between and spaced from center strip 42a and substrate side edge 28.

Body resonator strip 42a still further defines a second pair of shoulders defining an elongate, generally rectangularly-shaped, foot resonator strip 42e which is unitary with, and extends outwardly from, the end of body resonator strip 42a opposite the end thereof defining shoulder/base resonator strip 42b. Foot strip 42e extends in a direction transverse or normal to the body resonator strip 42a and in a relationship spaced from and generally parallel to the substrate short side edge 32. The opposed end faces of the foot resonator strip 42e are spaced from, and are disposed in a generally co-linear relationship with, the respective ends of wing strips 42c and 42d. Strip 42e defines a transverse inner edge or face 45 (FIG. 2) extending in an orientation generally parallel to substrate short side edges 32 and 34 respectively. The strips 42a, 42b, and 42e together define a generally "I"-shaped resonator strip or pattern.

In the embodiment shown, both of the resonator strips 42b and 42e preferably have a width (generally designated $W_3$ in FIG. 2) which is greater than the width (generally designated $W_1$ in FIG. 2) of body resonator strip 42a, while the respective wing resonator strips 42c and 42d each have a width (generally designated $W_2$ in FIG. 2) which is less than the width $W_1$ of body central resonator strip 42a.

It is understood that, in the embodiment shown, body resonator strip 42a defines the portion of the resonator pattern 42 adapted to provide the frequency generation and control features of the resonator 20 while the other resonator strips 42b-42e provide resonator grounding functions.

Thus, in accordance with the principles of the present invention, it is understood that the frequency generated by the resonator 20 is dependent in part upon the distance, generally designated $L_2$ in FIG. 2, between the inner transverse edge 43 of base resonator strip 42b (i.e., one of the ends of center resonator strip 42a) and the center of the aperture defined by the via 36k (FIG. 2) in the opposite end of the center resonator strip 42a/foot resonator strip 42e. This distance, of course, can be increased or decreased, for example, by increasing or decreasing the length (generally designated $L_3$ in FIG. 2) of base resonator strip 42b which, in turn, correspondingly increases or decreases the length $L_2$ of center resonator strip 42a.

In short, a shortening or decrease in the length $L_2$ of body resonator strip 42a relative to the base resonator strip 42b will result in a corresponding increase in the frequency of resonator 20, while an increase or lengthening of the length $L_2$ relative to the base resonator strip 42b will result in a corresponding decrease in the frequency of the resonator 20. This frequency is generally the quarter wavelength frequency of the resonator. The desired frequency and application for resonator 20 will, of course, determine the respective resonator pattern lengths $L_2$ and $L_3$.

As described above and shown in FIG. 1, spaced-apart vias 36 extend between the top and bottom surfaces 24 and 26 respectively of the substrate 22 in a generally normal relationship relative to substrate surface 24 and 26 and the ends thereof terminate in portions of substrate surface 24 located below respective portions of the resonator strips 42a, 42b, 42c, 42d, and 42e as described in more detail below.

Via 36b terminates below one end of body resonator strip 42a/center of base resonator strip 42b. Vias 36a and 36c respectively terminate below the opposed ends of base resonator strip 42b. Vias 36a-36c extend in a spaced-apart, co-linear relationship, along the length of base resonator strip 42b and adjacent substrate short edge 34. Vias 36d-36f terminate below, and extend in a spaced-apart, co-linear relationship, along the length of wing resonator strip 42c and adjacent substrate long edge 30. Via 36a is disposed in a generally co-linear relationship with vias 36d-36f. Vias 36g-36i terminate below, and extend in a spaced-apart, co-linear relationship, along the length of wing resonator strip 42d and adjacent opposed substrate long edge 28. Via 36c is disposed in a generally co-linear relationship with vias 36g-36i. Vias 36c, 36g, 36h, and 36i are diametrically opposed to vias 36a, 36d, 36e, and 36f respectively.

Via 36k terminates below the end of body resonator strip 42a/center of foot resonator strip 42e opposite the end thereof into which via 36b terminates. Vias 36j and 36l terminate below the opposed ends of foot resonator strip 42e. Vias 36j, 36k, and 36l all extend in a spaced-apart, co-linear relationship along the length of foot resonator strip 42e and in a diametrically opposed relationship relative to the vias 36a, 36b, and 36c terminating in opposed base resonator strip 42b.

As shown in FIG. 3, the bottom surface 26 of substrate 22 has a first generally rectangularly-shaped layer or strip 76 of conventional thick film conductor material formed thereon which defines a lower conductive ground plane. The bottom surface 26 of substrate 22 additionally defines a second, generally rectangularly-shaped, layer/strip/plane 77 of conventional thick film conductive material which defines the resonator RF signal input/output pad of the resonator 20.

Conductive RF signal input-output strip 77 is spaced from, and extends in a relationship generally parallel to, the edge 88 of ground strip 76 and the short side edge 32 of substrate 22.

Ground strip or layer 76 defines respective elongate peripheral edges 84, 86, 88, and 90 which are parallel to, and spaced from, the respective peripheral edges 28, 30, 32, and 34 of substrate 22. Edges 84 and 86 define the long side edges, while the edges 88 and 90 define the short side edges of rectangularly-shaped strip 76.

In FIG. 1, vias 36c, 36g, 36h, and 36i extend along the length of the substrate side edge 28 in a spaced-apart and generally co-linear relationship and define respective ends terminating in regions of substrate surface 26 adjacent and below the side longitudinal edge 84 of ground strip 76.

Vias 36a, 36d, 36e, and 36f extend along the length of the opposed substrate side edge 30 in a spaced-apart and generally co-linear relationship and define respective ends terminating in regions of the substrate surface 26 adjacent and below the opposite side longitudinal edge 86 of the ground layer 76.

Vias 36a, 36d, 36e, and 36f are diametrically opposed to vias 36c, 36g, 36h, 36i and 36l respectively.

Vias 36j, 36k, and 36l terminate below, and extend in spaced-apart, co-linear relationship along the length of, strip 77.

Via 36j is disposed in a co-linear relationship with vias 36a, 36d, 36e, and 36f in strip 76; via 36k is disposed in a co-linear, diametrically opposed relationship with via 36b in strip 76; and via 36l is disposed in a co-linear relationship with vias 36c, 36g, 36h, and 36i terminating in strip 76.

A plurality of solder spheres or balls 96 (see FIGS. 1 and 3), with a pitch of about 1.0 mm and a diameter of about 0.025 inches (0.64 mm), are mechanically and electrically attached to the bottom surface 26 of substrate 22 and, more specifically, are mechanically attached to and overlie the termination ends defined by vias 36 in the substrate surface 26.

Spheres 96 are composed of any suitable high temperature solderable material which does not reflow or change shape such as, for example, a 90% Pb and 10% Sn composition (or a lead-free copper with Sn/Ni plating composition if desired) and are adapted to allow the direct surface mounting of the resonator 20 to the printed circuit board of, for example, a WiMax base station. Although not described in detail herein or shown in any of the drawings, it is understood that the spheres 96 could also take the form of pads or strips of conductive material.

In accordance with the present invention, all of the solder spheres, except for the three solder spheres 96 which overlie the termination ends of vias 36j, 36k, and 36l, define respective ground pins or pads adapted to be electrically connected to the respective ground pads of the external printed circuit board to which the resonator 20 is adapted to be direct surface mounted. A shorted quarter wavelength element constitutes an inductive element.

The solder spheres 96 secured over the termination ends of vias 36j, 36k, and 36l define the RF signal input pins or tap pads of resonator 20 and are adapted for electrical coupling to the respective RF signal input pads of the external printed circuit board (not shown) to which the resonator 20 is adapted to be direct surface mounted to define an RF signal electrical conductive input/output path which allows an RF signal to pass successively through the balls 96 overlying vias 36j, 36k, and 36l; through respective vias 36j, 36k, and 36i; through resonator strip 42e, resonator strip 42a, resonator strip 42b, resonator strips 42d and 42e; back through the substrate through the respective vias which terminate below the respective strips 42b, 42d and 42e; into the balls 96 overlying the vias terminating in ground pad 76, and then into the ground pads of the board to which the resonator 20 is adapted to be direct surface mounted.

Resonator 20 additionally comprises a metal lid 98 (FIGS. 4A and 4B) which is preferably about 20 mils (0.5 mm high) and is adapted to be seated over and secured to the top surface 24 of substrate 22. In accordance with the present invention, lid 98 provides several functions including: providing an air gap above the resonator strip pattern 42; functioning as a Faraday shield; defining a ground plane above resonator strip pattern 42; and acting as a dust cover for resonator 20.

Lid 98 includes a top roof or surface 100 and four sidewalls 102, 104, 106, and 108 depending generally normally downwardly therefrom and defining respective peripheral end faces or edges 110, 114, 116, and 118. The roof 100 defines a pair of spaced-apart, co-linear laser trim apertures 122 and 124 positioned in a spaced-apart and parallel relationship relative to and adjacent the lid upper peripheral side wall 102. The metal lid 98 is optional.

Resonator 20 is preferably assembled using the following process sequence: A substrate 22 is provided and through-holes are laser-drilled therethrough. Via fill material paste is then screened over each of the through-hole openings. Both of the surfaces 24 and 26 of the substrate 22 are then rolled to force the fill material through the through-holes so as to define the plurality of conductive vias 36. Substrate 22 is then fired in an oven at approximately 850° C. to cure the via fill material.

Resonator conductive strip pattern 42 is then subsequently formed on the top surface 24 of substrate 22 thereon as by, for example, a screening or plating process or an ablative process followed by firing in an oven at about 850° C. to cure the Ag/Pd conductive material. The same step is repeated for both the ground layer 76 and input/output layer 77 of Ag/Pd conductive material which are screened onto the bottom surface 26 of the substrate 22.

A generally translucent optional protective coating or masking layer of dielectric material called a glasscoat (shown in FIG. 9 as layer 392), may then be screen printed over the portion of the top surface 24 of the substrate 22 including resonator pattern 42 and the substrate 22 is again fired in an oven at about 850° C. to cure the coat layer of dielectric material. A similar glass coat of dielectric material is screen-printed onto substantially the entire substrate bottom surface 26. The substrate 22 is then again fired in an oven at about 850° C. to cure the bottom coat layer of dielectric material. This coating is not optional, as it defines the positions of the solder balls.

Solder paste is then screen printed over the top surface 22 in the region adjacent each of the side edges thereof and the lid 98 is seated over the top surface 24 of substrate 22 in a relationship wherein the end faces 110, 112, 114, and 116 are seated over the solder paste. The solder is then reflowed to secure the lid 98 to the substrate 22.

Solder paste (not shown) is also screen printed over the termination ends of each of the respective vias 36 defined in the bottom surface 26 of substrate 22 (see FIG. 8). All of the solder spheres 96 are then seated over each of the points of solder paste and the solder paste is subsequently reflowed for permanently securing the solder spheres 96 to the substrate 22.

The terminal ends of resonator strips 42d and 42c are adapted to be aligned with the apertures 122 and 124 respectively in lid 96 so as to allow the strips 42d and 42c to be laser trimmed as necessary.

Finally, resonator 20 is tested and then taped and reeled for shipment to the customer.

Figure 5:
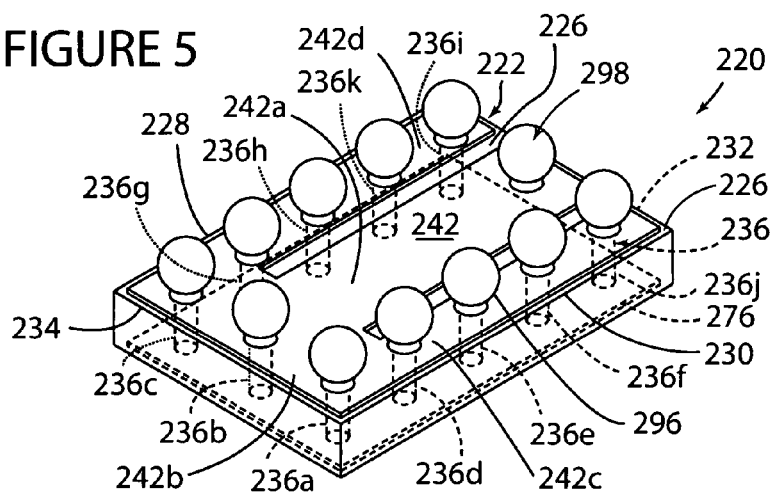
FIG. 5 is an enlarged, perspective view of a "bottom-side" embodiment of a ball grid array resonator in accordance with the present invention.

FIGS. 5-8 depict a "bottom-side" resonator embodiment 220 of the present invention. The use of the term "bottom side" is a reference to the placement of the resonator strip pattern 242 as described below in more detail on the side of the substrate 222 adapted to be seated against, and direct surface mounted to, the top of a customer's printed circuit board (now shown). FIG. 5 depicts the resonator 220 with the bottom side up to allow for illustration and description purposes.

Initially, and as described earlier with respect to the resonator embodiment 20, resonator 220 likewise initially comprises a generally rectangularly-shaped substrate or block 222.

Substrate 222 preferably has the same dimensions and composition as the substrate 22 and thus the earlier discussion and description relating to substrate 22 is hereby incorporated herein by reference.

Substrate 222 includes a top surface 224 (FIGS. 7 and 8), a bottom surface 226 (FIGS. 5, 6 and 8) adapted to face the top of the printed circuit board (not shown) on which the resonator 220 is adapted to be seated and direct surface mounted, and side surfaces defining peripheral edges 228, 230, 232, and 234 respectively.

Figure 6:
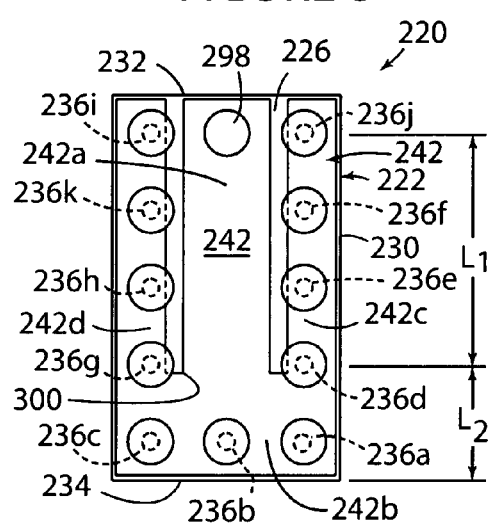
FIG. 6 is an enlarged, bottom plan view of the resonator of FIG. 5.
Figure 7:
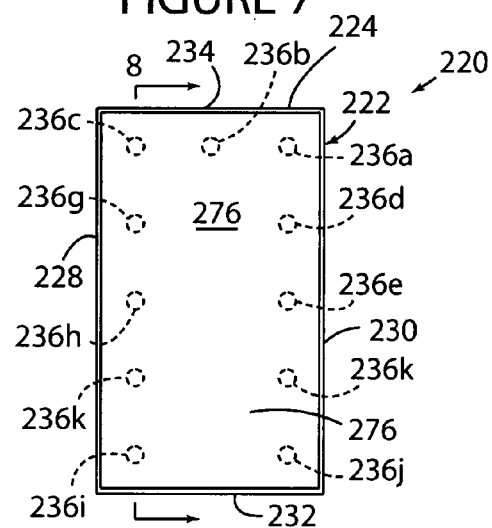
FIG. 7 is an enlarged, top plan view of the resonator of FIG. 5.

A plurality of spaced-apart, generally parallel elongate laser drilled through-holes defining conductive vias 236 (FIGS. 5 and 8) extend through the body of the substrate 222 and terminate in apertures/openings (FIGS. 6-8) defined in the top and bottom surfaces 224 and 226 respectively of the substrate 222 (FIGS. 6-8). Vias 236 extend through the substrate 222 in a generally normal relationship relative to the top and bottom substrate surfaces 224 and 226.

Resonator 220 differs in construction from resonator 20 in part in that, in resonator 220, both the solder spheres or balls 296 and conductive resonator pattern 242 are appropriately positioned, located, and formed on the same bottom surface or side of substrate 222 instead of the opposed top and bottom surfaces or sides of the substrate as in the resonator 20. As a result, the process for making the resonator 220 is similar to the process described earlier with respect to resonator 20 and the description of the process of making resonator 20 is thus incorporated herein by reference except that the process for making the resonator 220 includes the steps of securing the solder spheres 296 to the surface 226 in a relationship overlying the ends of the vias 236 terminating in respective strips of the resonator pattern 242 as described in more detail below.

Specifically, and as shown in FIGS. 5, 6 and 8, the surface 226 of substrate 222 defines a conductive thick film resonator metallization pattern 242 similar to resonator metallization pattern 42 and is defined by a plurality of unitary resonator strips 242a, 242b, 242c, and 242d similar in function and composition to corresponding resonator strips 42a, 42b, 42c, and 42d of resonator pattern 42 of resonator 20, the description of each of such strips thus being incorporated herein by reference as though fully described except as otherwise described below.

More specifically, resonator pattern 242 is defined by a first, generally rectangularly-shaped, center elongate resonator body strip 242a which is centrally positioned on the bottom surface 226 between ground substrate long side edges and extends along the length of the substrate 222 generally from a point spaced from the short side substrate edge 232 to a point adjacent and spaced from the opposite short side substrate edge 234. Strip 242a extends in a direction generally parallel to substrate long side edges 228 and 230 and normal to short side substrate edges 232 and 234.

Center resonator body strip 242a includes a pair of shoulders which together define a second, elongate, generally rectangularly-shaped, resonator base strip 242b which is unitary with one end of the body strip 242a and extends along the width of substrate 222 in an orientation generally normal to the body strip 242a. Shoulder strip 242b is positioned in an adjacent, spaced-apart and parallel relationship to the short side substrate edge 232. Strips 242a and 242b thus in combination define a generally "T"-shaped resonator strip or pattern.

Resonator pattern 242 still further defines a pair of generally rectangularly-shaped wing resonator strips 242c and 242d which extend respectively unitarily outwardly from the opposed peripheral ends of shoulder/base strip 242b.

Wing strip 242c extends along the length of substrate 222 from one end of the shoulder/base strip 242b and substrate short side edge 232 to a point adjacent and spaced from the opposed peripheral side edge 234 in a relationship spaced from and parallel to both the body strip 242a and the long side substrate edge 230.

Wing strip 242d extends along the length of substrate 222 from the opposed end of shoulder/base strip 242b and substrate short side edge 232 to a point adjacent and spaced from the opposed peripheral substrate side edge 234 in a relationship spaced from and parallel to both the body strip 242a and the opposed long side substrate edge 228.

In the embodiment shown, wing strips 242c and 242d have a length generally equal to the length of body strip 242a and a width which is less than the width of center body resonator strip 242a. Base strip 242b has a width generally equal to or greater than the width of body strip 242a and wing resonator strips 242c and 242d.

It is understood, of course, that the center body resonator strip 242a defines the portion of the resonator pattern 242 adapted to provide the frequency generation and control characteristics of the resonator 220 while the resonator strips 242b, 242c, and 242d constitute and provide the grounding structure and function.

As shown in FIGS. 7 and 8, top surface 224 of substrate 222 includes a single layer 276 of thick film metallized conductive material similar in composition and function to the strip 76 on the surface 26 of resonator 20, the description of which is thus incorporated herein by reference. FIG. 8 also depicts the glasscoat layer 292 which may be applied to the top of layer 276 during the manufacturing process.

More particularly, layer 276 is characterized in that it defines a ground plane or layer which covers substantially the entire surface 224 of substrate 222 and includes respective edges adjacent and spaced from the edges 228, 230, 232, and 234 of substrate 222.

Substrate 222 additionally defines a plurality of conductive vias 236 defined therein which, as shown in FIGS. 5 and 8, extend through the body of substrate 222 in spaced-apart and parallel relationship and define via termination ends in respective substrate surfaces 224 and 226, and are adapted to be filled with thick film conductive material as shown in FIG. 8 and described above with respect to resonator embodiment 20, and thus incorporated herein by reference.

More specifically, it is understood that resonator 220 defines a via 236b which terminates in and defines a termination end located below the center of base resonator strip 242b. Resonator 220 still further defines vias 236a and 236c which terminate in and define termination ends in the opposed ends of base resonator strip 242b. Spaced-apart, co-linear vias 236a, 236b, and 236c extend along the full width of the resonator strip 242b adjacent and spaced from substrate short edge 232. Vias 236a, 236b, and 236c additionally define respective opposed via termination ends in the top substrate surface 224, extending along the short side substrate edge 232, and located below the top edge of ground layer 276.

The resonator 220 still further defines a plurality of spaced-apart, co-linear vias 236d, 236e, 236f and 236j which terminate in and define respective via termination ends protruding into, and extending along the full length of, the portion of bottom substrate surface 226 located below wing strip 242c; and respective opposed termination ends in the top substrate surface 224 and extending below ground layer 276 along the long side substrate edge 230. Vias 236d, 236e, 236f, and 236j are all positioned in a co-linear relationship with via 236a.

Resonator 220 additionally defines a plurality of spaced-apart, co-linear vias 236g, 236h, 236k, and 236i which terminate in and define respective via termination ends protruding into, and extending along the full length of, the bottom substrate surface 226 below resonator strip 242d; and respective opposed termination ends protruding into the top substrate surface 224 and extending below the portion of ground layer 226 extending along the long side substrate edge 228. Vias 236g, 236h, 236k, and 236i are all positioned in a co-linear relationship with via 236c.

Solder spheres/balls 296 are adapted to be secured to the surface 226 of substrate 222 as shown in FIGS. 5, 6, and 8. All of the solder spheres 296 are adapted to be seated over and secured to the respective filled termination ends of vias 236 in the same overlying manner and relationship as described earlier with respect to the solder spheres/balls 96 of resonator 20. In the embodiment shown, all of the solder balls/spheres 296 overlying the termination ends of respective vias 236 define respective ground pins adapted to be positioned in direct surface contact with the respective ground pads of an external printed circuit board (not shown) to which the resonator 222 is adapted to be direct surface mounted.

In accordance with the present invention, an additional solder ball/sphere 298 (FIGS. 5 and 6) is seated over the end of body resonator strip 242a adjacent the short side edge 232 and defines the input RF signal pin or pad of resonator 222 adapted for direct surface mount contact with the respective input RF signal pad of the external printed circuit board (not shown) on which the resonator 222 is adapted to be direct surface mounted.

In the "bottom-side" construction of FIGS. 5-8, it is understood that the conductive layer 276 on the surface 224 of substrate 222 comprises the first ground plane while the conductor pattern on the customer's printed circuit board (not shown) provides the other second required ground plane. The required air gap between the resonator 220 and ground planes is provided and defined by the 0.025 inch space created by the solder spheres 296 and 298 between the bottom surface 226 of the resonator 220 and the customer's printed circuit board (not shown).

Thus, in accordance with this embodiment of the invention and referring to FIGS. 5, 6 and 8, the RF signal is adapted to pass from the RF input pad on the PCB (not shown) into and through the solder sphere 298, then through the length of resonator strip 242a from the end thereof adjacent substrate short side edge 232 in the direction of opposed substrate short side edge 234, and then through each of the ground resonator strips 242b-d which are coupled to ground on the PCB through spheres 296 and then also through the substrate and into the ground layer 276 on the surface 224 of substrate 222 through respective vias whose ends terminate in respective strips 242b-d.

In a manner similar to that described earlier with respect to resonator 20, it is understood that the frequency of resonator 220 is dependent in part upon the effective length of body resonator strip 242a which in turn is dependent upon the distance (generally designated $L_1$ in FIG. 6) between the center of sphere 298 at the end of center body resonator strip 242a adjacent short side edge 232 and the inner edge 300 of base resonator strip 242b (i.e., the opposite end of body resonator strip 242a) adjacent substrate short side edge 234, which in turn is dependent upon the length (generally designated $L_2$ in FIG. 6) of the base strip 242b.

Thus, for example, it is understood that increasing the length of base resonator strip 242b will cause a decrease in the effective length of body resonator strip 242a (i.e., a decrease in the distance $L_1$ in FIG. 6) which will cause a corresponding increase in the frequency of resonator 200.

FIGS. 9-12 depict another "bottom-side" resonator embodiment 320 of the present invention. Again, the use of the term "bottom side" is a reference to the placement of the resonator strip pattern 342 (FIGS. 9, 10, and 12) as described below in more detail on the side of the substrate 322 adapted to be seated against, and direct surface mounted to, the top of a customer's printed circuit board (not shown). FIG. 9 depicts the substrate 320 with the bottom side up for illustration purposes.

Initially, and as described earlier with respect to the resonator embodiment 20, resonator 320 likewise initially comprises a generally rectangularly-shaped substrate or block 322.

Substrate 322 preferably has the same dimensions and composition as the substrate 22 and thus the earlier discussion and description relating to substrate 22 is hereby incorporated herein by reference.

Substrate 322 includes a top surface 324 (FIGS. 11 and 12), a bottom surface 326 (FIGS. 9, 10, and 12) adapted to face the top of the printed circuit board (not shown) on which the resonator 320 is adapted to be seated and direct surface mounted, and side surfaces defining peripheral edges 328, 330, 332, and 334 respectively.

A plurality (five in particular) of spaced-apart, parallel, elongate laser drilled through-holes defining conductive vias 336 (FIGS. 9 and 12) extend through the body of the substrate 322 and terminate in the top and bottom surfaces 324 and 326 respectively of the substrate 322. Vias 336 extend through the substrate 322 in a generally normal relationship relative to the top and bottom substrate surfaces 324 and 326.

Resonator 320 is similar to resonator 220 in that both the solder spheres or balls 396 (five in particular) and conductive resonator pattern 342 are appropriately positioned, located, and formed on the same bottom surface 326 of substrate 322 instead of the opposed top and bottom surfaces or sides of the substrate as in the resonator 20.

As a result, the process for making the resonator 320 is similar to the process described earlier with respect to resonator 20 and the description of the process of making resonator 20 is thus incorporated herein by reference except that the process for making the resonator 320 includes the steps of securing the solder spheres 396 in a relationship overlying the ends of the vias 336 terminating in the substrate surface 326 as described in more detail below.

Specifically, and as shown in FIGS. 9, 10 and 12, the surface 326 of substrate 322 is coated with a layer of conductive thick film defining a resonator metallization pattern 342 defined by a plurality of unitary, interconnected resonator strips 342a, 342b, 342c, and 342d similar in function and composition to corresponding resonator strips 242a, 242b, 242c, and 242d of resonator pattern 242 of resonator 220, the description of each of such strips thus being incorporated herein by reference as though fully described except as otherwise described below.

More specifically, resonator pattern 342 is defined by a first, generally rectangularly-shaped, center resonator body strip 342a which is centrally positioned on the bottom surface 326 between substrate long side edges 328 and 330 and extends along the length of the substrate 322 in a direction generally parallel to substrate long side edges 328 and 330 and normal to short side substrate edges 332 and 334. In the embodiment of FIGS. 9-12, body strip 242a is disposed adjacent and normal to short side substrate edge 332.

Resonator pattern 342 defines a second, elongate, generally rectangularly-shaped, resonator base strip 342b, which is unitary with the end of the body strip 342a which is located opposite the end thereof adjacent substrate short side edge 332. Base strip 342b occupies a majority of the bottom substrate surface 326 located below body strip 342a and defines respective opposed side peripheral edges spaced from and parallel to respective substrate long side edges 328 and 330 and a lower peripheral edge spaced from and parallel to short lower substrate edge 334. Base strip 342b extends along the width of substrate 322 in an orientation generally normal to the body strip 342a.

Resonator pattern 342 still further defines a pair of generally rectangularly-shaped wing resonator strips 342c and 342d which extend respectively unitarily outwardly from opposed ends of the upper peripheral edge of base strip 342b.

Wing strip 342c extends along the length of substrate 322 from one end of the edge of base strip 342b to a point adjacent and spaced from the peripheral side edge 332 in a relationship spaced from and parallel to both the body strip 342a and the long side substrate edge 330. Stated another way, body strip 342c is located on surface 326 between and spaced from the body strip 342a and the substrate side edge 330.

Wing strip 342d, which is diametrically opposed to wing strip 342c, extends along the length of substrate 322 from the opposed end of the upper edge of base strip 342b to a point adjacent and spaced from the peripheral substrate side edge 332 in a relationship spaced from and parallel to both the body strip 342a and the opposed long side substrate edge 328.

In the embodiment shown, wing strips 342c and 342d have a length generally equal to the length of body strip 342a and a width which is less than the width of center body resonator strip 342a. Moreover, body resonator strip 342a has a width which is less than the width of base strip 342b.

It is understood, of course, as with the earlier resonator embodiments 20 and 220, that the center body resonator strip 342a defines the portion of the resonator pattern 342 adapted to provide the frequency generation and control characteristics of the resonator 320 while the resonator strips 342b, 342c, and 342d constitute and provide the grounding structure and function.

As shown in FIGS. 11 and 12, surface 324 of substrate 322 includes a single layer 376 of thick film metallized conductive material similar in composition and function to the strips 76 and 276 resonators 20 and 220, the description of which is incorporated herein by reference.

More particularly, layer 376 is characterized in that it defines a ground plane or layer which covers substantially entire surface 324 of substrate 322 and defines four respective edges adjacent and spaced from the edges 328, 330, 332, and 334 of substrate 322.

Substrate 322 additionally defines a plurality of conductive vias 336 defined therein which, as shown in FIGS. 9 and 12, extend through the body of substrate 322 in spaced-apart and generally parallel relationship and define via termination ends in respective substrate surfaces 324 and 326 as described in more detail below. Vias 336 are adapted to be filled with thick film conductive material as described earlier and shown in FIG. 12.

As is shown in FIGS. 9-12, it is understood that the respective resonators 220 and 320 differ in that resonator 220 includes a total of eleven (11) vias defined therein while the resonator 320 includes only a total of four (4) vias 336a, 336c, 336f, and 336k defined therein.

More specifically, it is understood that the vias 336a and 336c terminate in and define respective termination ends in respective portions of substrate surface 326 located below the lower respective opposed corners of base resonator strip 342b; and that the vias 336f and 336k terminate in and define respective termination ends in respective portions of substrate surface 326 located below the lower respective ends of respective wing strips 342c and 342d. Vias 336a, 336c, 336f, and 336k additionally define respective opposed via termination ends in respective portions of the substrate top surface 324, located below the top ground layer 376.

Vias 336c and 336k are co-linearly aligned. Vias 336a and 336f are co-linearly aligned and in a diametrically opposed relationship to vias 336c and 336k.

A total of four solder spheres/balls 396 are adapted to be secured to the surface 326 of substrate 322 as shown in FIGS. 9, 10, and 12. More specifically, solder spheres 396 are adapted to be seated over and secured to the respective filled ends of vias 336 terminating in substrate bottom surface 326 in the same overlying manner and relationship as described earlier with respect to the solder spheres/balls 96 of resonator 20. In the embodiment shown, all of the solder balls/spheres 396 overlying the respective termination ends of vias 336 define respective ground pins adapted to be positioned in direct surface contact with the respective ground pads of an external printed circuit board (not shown) to which the resonator 322 is adapted to be direct surface mounted.

An additional solder ball/sphere 398 is seated over the end of body resonator strip 342a adjacent the short side edge 332 and which defines the input RF signal pin or pad of resonator 322 adapted for direct surface mount contact with the respective input RF signal pad of the external printed circuit board (not shown) on which the resonator 322 is adapted to be direct surface mounted.

In this "bottom-side" construction of FIGS. 9-12, it is understood that the conductive layer 376 on the surface 324 of substrate 322 comprises the first ground plane while the conductor pattern on the customer's printed circuit board (not shown) provides the other second required ground plane. Although not shown, the required air gap between the resonator 320 and the ground planes is provided and defined by the 0.025 inch space created by the solder spheres 396 and 398 between the bottom surface 326 of the resonator 320 and the customer's printed circuit board (not shown).

Thus, in accordance with this embodiment of the invention and referring to FIGS. 9, 10, and 12, the RF signal is adapted to pass from the RF input pad on the PCB (not shown) into and through the solder sphere 398, through the length of resonator strip 342a, through each of the ground resonator strips 342b-d which are coupled to ground on the PCB through spheres 396 and to the ground layer 376 on the surface 324 of substrate 322 through the respective vias whose ends terminate in portions of the substrate surface 324 located below ground layer 376.

In a manner similar to that described earlier with respect to resonator 220, it is understood that the frequency of resonator 320 is dependent in part upon the effective length of the body resonator strip 342a which, in turn, is dependent upon the distance (generally designated L1 in FIG. 10) between the center of sphere 398 at the end of center body resonator strip 342a adjacent short side edge 332 and the outside edge 343 of base resonator strip 342b unitary with the opposed end of body resonator strip 342a which in turn is dependent upon the length (generally designated L2 in FIG. 10) of the base resonator strip 342b. In the embodiment of FIGS. 9-12, body strip 342a is about one-half the length, and less than one-half the width, of the base resonator strip 342b. Each of the wing resonator strips 342c and 342d are about the same length as, and about one-half the width of, body resonator strip 342a.

Figure 13:
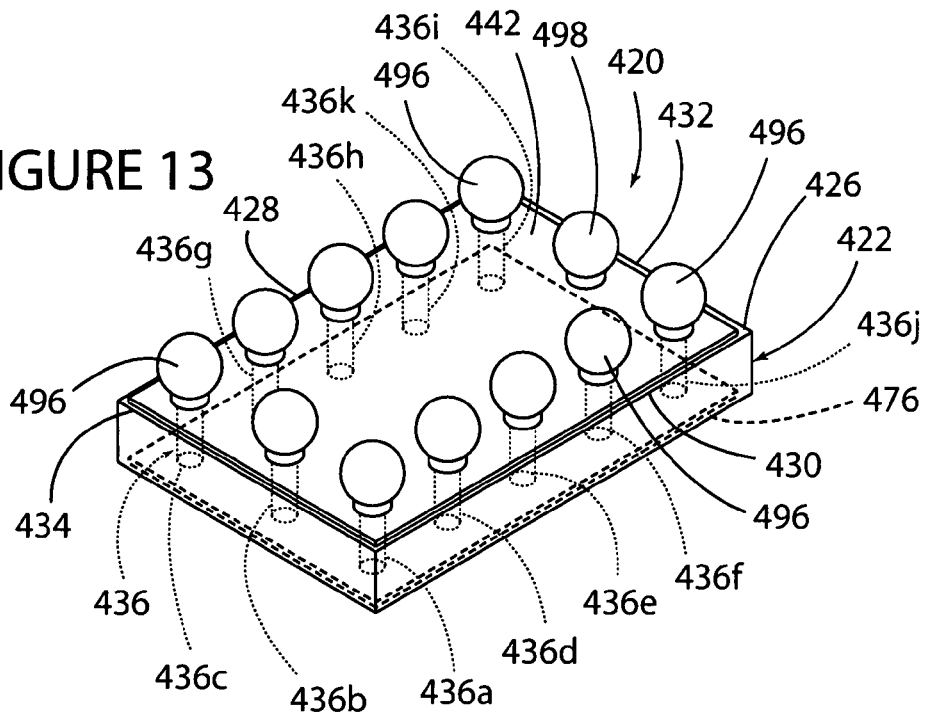
FIG. 13 is an enlarged, perspective view of yet another "bottom-side" embodiment of a ball grid array resonator in accordance with the present invention.
Figure 14:
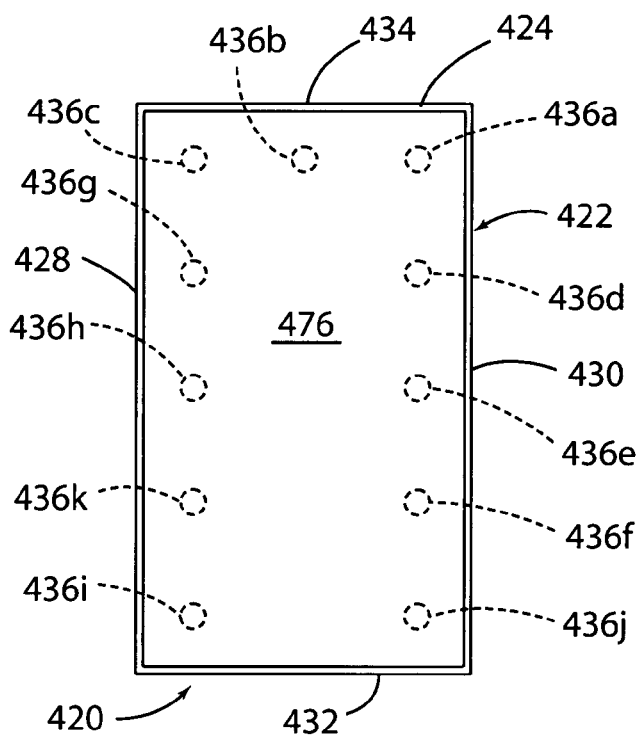
FIG. 14 is an enlarged, top plan view of the resonator of FIG. 13.

FIGS. 13 and 14 depict yet a further "bottom-side" resonator embodiment 420 of the present invention which, as described above, is a reference to the placement of both the resonator strip pattern 442 and the solder spheres 496 as described below in more detail on the same bottom surface 426 of the substrate 422 adapted to be seated against, and direct surface mounted to, the top of a customer's printed circuit board (not shown). FIG. 13 depicts the resonator 420 with its bottom side up for illustration purposes.

Initially, and as described earlier with respect to the resonator embodiments 20, 220, and 320, resonator 420 likewise initially comprises a generally rectangularly-shaped substrate or block 422.

Substrate 422 preferably has the same dimensions and composition as the substrate 22 and thus the earlier discussion and description relating to substrate 22 is hereby incorporated herein by reference.

Substrate 422 includes a top surface 424 (FIG. 14), a bottom surface 426 (FIG. 13) adapted to face the top of the printed circuit board (not shown) on which the resonator 420 is adapted to be seated and direct surface mounted, and side surfaces defining peripheral edges 428, 430, 432, and 434 respectively.

A plurality (five in particular) of elongate laser drilled through-holes defining conductive vias 436 (FIGS. 13 and 14) extend through the body of the substrate 422 in spaced-apart and generally parallel relationship and terminate in apertures/openings defined in the top and bottom surfaces 424 and 426 respectively of the substrate 422. Vias 436 extend through the substrate 422 in a generally normal relationship relative to the top and bottom substrate surfaces 424 and 426.

Resonator 420 is similar in construction to the resonators 220 and 320 in that both the solder spheres or balls 496 and conductive resonator pattern 442 are appropriately positioned, located, and formed on the bottom surface 426 of substrate 422. As a result, the process for making the resonator 420 is similar to the process described earlier with respect to resonator 20; and the description of the process of making resonator 20 is thus incorporated herein by reference except that the process for making the resonator 426 includes the steps of securing the solder spheres 496 to the surface 424 in a relationship overlying the conductive layer 492 and the ends of the vias 436 terminating in regions of the surface 426 located below conductive layer 442.

However, and unlike the resonator embodiments 220 and 320 where the respective resonator patterns 242 and 342 are defined by a plurality of respective resonator strips formed on the respective bottom substrate surfaces 226 and 326, it is understood that the resonator metallization pattern 442 of resonator 420 comprises a generally rectangularly-shaped layer of conductive material which covers substantially the entire or full bottom surface 426 of resonator 420. As such, resonator metallization layer 442 defines respective opposed long side edges adjacent to and spaced from respective opposed long side substrate edges 428 and 430 and respective opposed short side edges adjacent to and spaced from respective short side substrate edges 432 and 434.

As shown in FIGS. 13 and 14, top surface 424 of substrate 422 includes a single layer 476 of thick film metallized conductive material similar in composition and size to the layer 442 on the surface 426 of resonator 420. More particularly, layer 476 is characterized in that it defines a ground plane or layer which covers substantially the entire surface 424 of substrate 422 and includes respective edges adjacent and spaced from the edges 428, 430, 432, and 434 of substrate 422.

Substrate 422 additionally defines a plurality of conductive vias 436 defined therein and similar to the vias 236 defined in substrate 222 which, as shown in FIGS. 13 and 14, extend through the body of substrate 422 in spaced-apart and generally parallel relationship and define via termination ends in portions of both of the opposed surfaces 424 and 426. Vias 436, in the same manner as vias 236 and 336, are adapted to be filled with thick film conductive material.

More specifically, resonator 420 defines a plurality of spaced-apart co-linear vias 436a, 435d, 436e, 436f, and 436j which terminate in and define respective via termination ends in the respective surfaces 424 and 426 and extend along the length of, and adjacent to, peripheral long side substrate edge 430 in spaced-apart and generally co-linear relationship.

Resonator 420 additionally defines a plurality of spaced-apart, co-linear vias 436c, 436g, 436h, 436k, and 436i which terminate in and define respective via termination ends in portions of respective surfaces 424 and 426 and extend along the length of, and adjacent to, the peripheral long side substrate edge 428 in a diametrically opposed, spaced-apart and co-linear relationship to respective vias 436a, 436d, 436e, 435f, and 436j.

As also shown in FIGS. 13 and 14, resonator 420 defines an additional via 436b which terminates in, and defines respective termination ends in a center portion of substrate surfaces 424 and 426 adjacent substrate short side edge 434. Via 436b is co-linearly aligned with, and spaced from, vias 436a and 436c. All of the vias underlie peripheral end portions of the respective conductive layers 442 and 476.

Solder spheres/balls 496 are adapted to be secured to the surface 426 of substrate 422 as shown in FIG. 13 in a relationship wherein spheres 496 are seated over and are secured to the respective filled termination ends of vias 436 in the same overlying manner and relationship as described earlier with respect to the earlier resonator embodiments.

In the embodiment shown, all of the solder balls/spheres 496 overlying the termination ends of vias 436 define respective ground pins adapted to be positioned in direct surface contact with the respective ground pads of an external printed circuit board (not shown) to which the resonator 422 is adapted to be direct surface mounted.

An additional solder ball/sphere 498 is centrally located along, and seated on, the top peripheral edge of resonator conductive layer 442 which is located adjacent and spaced from the top peripheral edge 432 of substrate 422. Sphere 498 is disposed in co-linear and parallel relationship with the two spheres 496 extending along the top peripheral edge 426 of substrate 422.

As with the spheres 298 and 398 of resonator embodiments 220 and 320, sphere 498 defines the input RF signal pin or pad of resonator 422 adapted for direct surface mount contact with the respective input RF signal pad of the external printed circuit board (not shown) on which the resonator 422 is adapted to be direct surface mounted.

In the "bottom-side" construction of FIGS. 13 and 14, it is understood that the conductive layer 476 on the surface 424 of substrate 422 comprises the first ground plane while the conductor pattern on the customer's printed circuit board (not shown) provides the other second required ground plane. The required air gap between the resonator 420 and ground planes is provided and defined by the 0.025 inch space created by the solder spheres 496 and 498 between the bottom surface 426 of the resonator 420 and the customer's printed circuit board (not shown).

Thus, in accordance with this embodiment of the invention and referring to FIGS. 13 and 14, the RF signal is adapted to pass from the RF input pad on the PCB (not shown) into and through the solder sphere 498, then through the length of, and full area of, the resonator strip 442 from the end thereof adjacent substrate short side edge 432 to the end thereof adjacent opposed substrate short side edge 434, through each of the spheres 496, and then into and through the ground layer 476 on the opposite substrate surface 424 through the respective vias 436.

Figure 15:
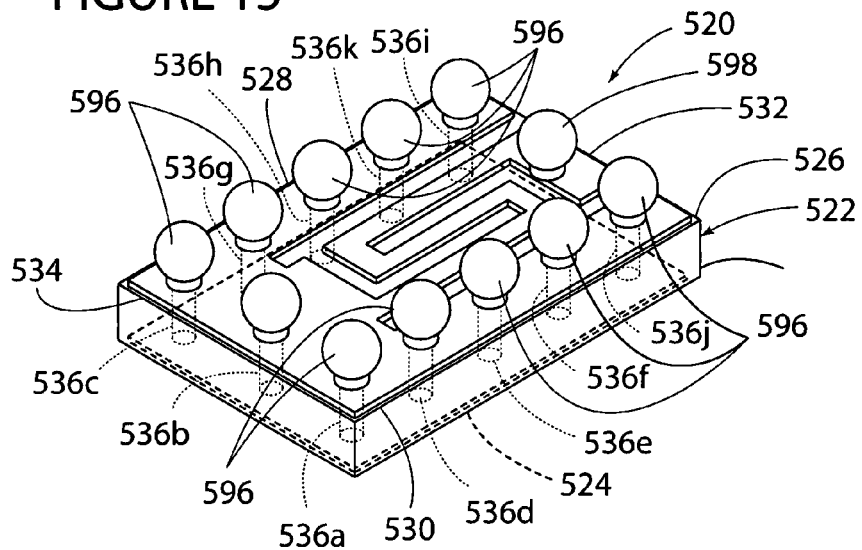
FIG. 15 is an enlarged, perspective view of yet a further "bottom-side" embodiment of a ball grid array resonator in accordance with the present invention.
Figure 16:
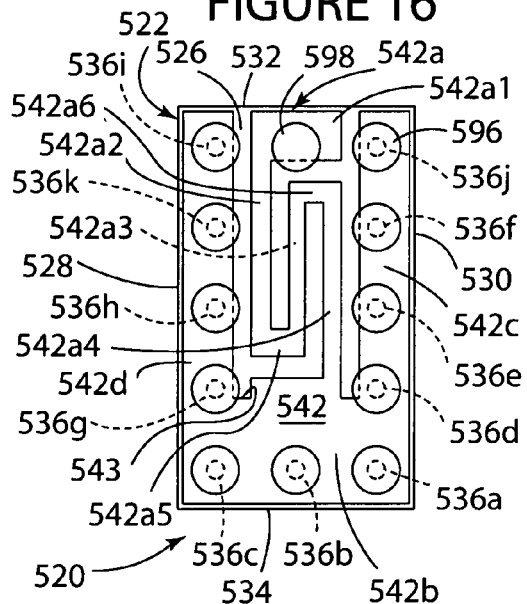
FIG. 16 is an enlarged, bottom plan view of the resonator of FIG. 15.
Figure 17:
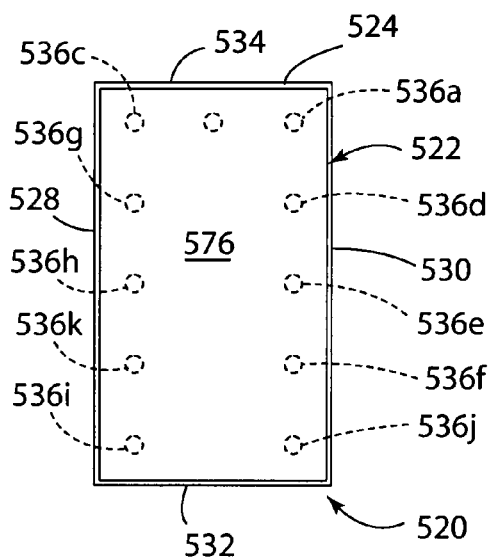
FIG. 17 is an enlarged, top plan view of the resonator of FIG. 15.

FIGS. 15-17 depict still a further "bottom-side" resonator embodiment 520 of the present invention. Once again, the use of the term "bottom side" is a reference to the placement of the resonator strip pattern 542 as described below in more detail on the bottom surface 526 of the substrate 522 adapted to be seated against, and direct surface mounted to, the top of a customer's printed circuit board (not shown). FIG. 15 shows the resonator 520 with the bottom surface 526 thereof facing up for description purposes.

Initially, and as described earlier with respect to the other "bottom-side" resonator embodiments of the present invention, resonator 520 likewise initially comprises a generally rectangularly-shaped substrate or block 522.

Substrate 522 preferably has the same dimensions and composition as the substrate 22 and thus the earlier discussion and description relating to substrate 22 is hereby incorporated herein by reference.

Substrate 522 includes a top surface 524 (FIG. 17), a bottom surface 526 (FIGS. 15 and 16) adapted to face the top of the printed circuit board (not shown) on which the resonator 520 is adapted to be seated and direct surface mounted, and side surfaces defining peripheral edges 528, 530, 532, and 534 respectively.

A plurality of elongate laser drilled through-holes defining conductive vias 536 (FIG. 15) extend through the body of the substrate 522 in a spaced-apart and generally parallel relationship and terminate in apertures/openings defined in portions of the respective top and bottom substrate surfaces 524 and 526 respectively of the substrate 522 located below respective metallization layers 576 and 542 as described in more detail below. Vias 536 extend through the substrate 522 in a generally normal relationship relative to the top and bottom substrate surfaces 524 and 526.

Resonator 520 is similar in structure to the previously discussed resonator embodiments 220, 320, and 420 in that both the solder spheres or balls 596 and conductive resonator pattern 542 are appropriately positioned, located, and formed on the same bottom surface 526 of substrate 522.

The process for making the resonator 520 is similar to the process described earlier with respect to resonator 20 and the description of the process of making resonator 20 is thus incorporated herein by reference except that the process for making the resonator 520 includes the steps of securing the solder spheres 596 to the surface 524 in a relationship overlying the ends of the vias 536 terminating in respective portions of the substrate surface 526 located below respective strips of the resonator pattern 542 as described in more detail below.

Specifically, and as shown in FIGS. 15 and 16, the surface 526 of substrate 522 includes a layer of metallized thick firm conductive material defining a conductive thick film resonator metallization pattern 542 defined by a plurality of unitary resonator strips 542a, 542b, 542c, and 542d similar in function and composition to the strips of the respective patterns of resonator embodiments 20, 220, 320, and 420, the description of each of such strips thus being incorporated herein by reference as though fully described except as otherwise described below.

More specifically, resonator pattern 542 is defined by a first, generally centrally positioned unitary "serpentine" pattern strip 542a which is centrally positioned on the bottom surface 526 between substrate long side peripheral edges 528 and 530.

Still more specifically, serpentine center region 542a is defined by an "island" strip 542a1 which is disposed centrally adjacent and spaced from the upper short side peripheral edge 532 of substrate 522. Serpentine region 542a is still further defined by three spaced-apart, generally parallel and elongate strips 542a2, 542a3, and 542a4 which are interconnected by respective corner or bend strips 542a5 and 542a6. Strips 542a2, 542a3, and 542a4 are all oriented in a relationship normal to substrate short side edges 532 and 534 and parallel to substrate long side edges 528 and 530.

Referring to FIGS. 15 and 16, it is understood that strip 542a2 extends unitarily and generally normally outwardly from the "island" strip 542a1 in the direction of opposed substrate edge 534 and terminates into corner or bend strip 542a5 which, in turn, extends into elongate strip 542a3 which extends back in the direction of substrate short side edge 532 and into corner or bend strip 542a6 which, in turn, extends into elongate strip 542a4 which extends in the direction and towards substrate side edge 534 and terminates into base resonator strip 542b.

Base resonator strip 542b is disposed adjacent and spaced from the lower substrate edge 534 and extends generally the width of substrate 522.

Resonator pattern 542 still further defines a pair of generally rectangularly-shaped wing resonator strips 542c and 542d which extend respectively unitarily outwardly from the opposed ends of the inner peripheral edge 543 of base strip 542b.

Wing strip 542c extends along the length of substrate 522 from the inner edge 543 of base strip 542b to a point adjacent and spaced from the opposed peripheral short side substrate edge 532 in a relationship spaced from, parallel to, and adjacent to both the center serpentine strip 542a and the long side substrate edge 530. Stated another way, wing strip 542c is located between and spaced from the serpentine region 542a on one side and the substrate long side edge 530 on the opposed side.

Wing strip 542d extends along the length of substrate 522 from the end of the inner edge 543 of base strip 542b, which is opposite the end from which extends the wing strip 542c, to a point adjacent and spaced from the peripheral substrate short side edge 532 in a relationship spaced from, parallel to, and adjacent to, both the serpentine strip 542a and the opposed long side substrate edge 528. Wing strips 542c and 542d are diametrically opposed to each other and are disposed in a relationship generally parallel to the strips 542a2, 542a3, and 542a4 of serpentine pattern 542a.

It is understood, of course, as with the earlier embodiments, that the center serpentine resonator strip 542a defines the portion of the resonator pattern 542 adapted to provide the frequency generation and control characteristics of the resonator 520 while the resonator strips 542b, 542c, and 542d constitute and provide the grounding structure and function.

As shown in FIG. 17, top surface 524 of substrate 522 includes a single layer 576 of thick film metallized conductive material similar in composition and function to the strip 76 on the surface 26 of resonator 20, the description of which is thus incorporated herein by reference.

More particularly, layer 576 is characterized in that it defines a ground plane or layer which covers substantially the entire surface 524 of substrate 522 and includes respective edges adjacent and spaced from the edges 528, 530, 532, and 534 of substrate 522.

As briefly discussed above, substrate 522 additionally defines a plurality of conductive vias 536 defined therein which, as shown in FIG. 15, extend through the body of substrate 522 and define via termination ends in respective portions of the substrate surfaces 524 and 526. As with the earlier embodiments, vias 536 are adapted to be filled with thick film conductive material as shown in FIG. 8.

More specifically, it is understood that resonator 520 defines a via 536b which terminates in and defines a termination end in a portion of substrate surface 526 located below the center of base strip 542b. Resonator 520 still further defines vias 536a and 536c which terminate in and define respective termination ends in respective portions of the substrate surface 526 located below the opposed ends of base resonator strip 542b. Vias 536a, 536b, and 536c extend along the full width of the resonator strip 542b in spaced-apart, parallel, and generally co-linear relationship. Vias 536a, 536b, and 536c additionally define respective opposed via termination ends in respective portions of the substrate surface 524 protruding into the top ground layer 576 on the top substrate surface 524 and extending along the short side substrate edge 532.

The resonator 520 still further defines a plurality of spaced-apart co-linear vias 536d, 536e, 536f and 536j defining respective via termination ends in the substrate surfaces 524 and 526 which extend along the long side substrate edge 530 in spaced-apart and generally parallel relationship. Vias 536d, 536e, 536f, and 536j are all positioned in a co-linear relationship with via 536a and extend the length of and below wing strip 542c.

Resonator 520 additionally defines a plurality of spaced-apart, co-linear vias 536g, 536h, 536k, and 536i defining respective via termination ends in the substrate surfaces 524 and 526 which extend along the opposite long side substrate edge 528 in spaced-apart, parallel, and co-linear relationship. Vias 536g, 536h, 536k, and 536i are all positioned in a co-linear relationship with via 536c and are diametrically opposed to the vias 536a, 536d, 536e, 536f and 536j respectively. Vias 536g, 536h, 536k, and 536i are all located below, and extend the length of, resonator wing strip 542d.

Solder spheres/balls 596 are adapted to be seated over and secured to the respective filled termination ends of vias 536 terminating in surface 526 in the same overlying manner and relationship as described with respect to the solder spheres/balls of the earlier described resonator embodiment 20. In the embodiment shown, all of the solder balls/spheres 596 overlying the termination ends of vias 536 define respective ground pins adapted to be positioned in direct surface contact with the respective ground pads of an external printed circuit board (not shown) to which the resonator 522 is adapted to be direct surface mounted.

In accordance with the present invention, an additional solder ball/sphere 598 is seated on the island strip 542a1 of center serpentine strip 542*a* and defines the input RF signal pin or pad of resonator 522 adapted for direct surface mount contact with the respective input RF signal pad of the external printed circuit board (not shown) on which the resonator 522 is adapted to be direct surface mounted.

In the "bottom-side" construction of FIGS. 15-17, it is understood that the conductive layer 576 on the surface 524 of substrate 522 comprises the first ground plane while the conductor pattern on the customer's printed circuit board (not shown) provides the other second required ground plane. The required air gap between the resonator 520 and ground planes is provided and defined by the 0.025 inch space created by the solder spheres 596 and 598 between the bottom surface 526 of the resonator 520 and the customer's printed circuit board (not shown).

Thus, in accordance with this embodiment of the invention and referring to FIGS. 15-17, the RF signal is adapted to pass from the RF input pad on the PCB (not shown) into and through the solder sphere 298, then through the island 542*a*1 of conductive metallized material and each of the strips of serpentine metallized region 542*a* and then into and through each of the ground resonator strips 542*b-d* which are coupled to ground on the PCB through spheres 596 and then through the substrate 522 and into and through the ground layer 576 on the surface 524 of substrate 522 through the respective vias whose ends terminate in respective strips 542*b-d*.

In a manner similar to that described earlier with respect to the earlier described resonator embodiments, it is understood that the frequency of resonator 500 is dependent in part upon the effective length of respective center strip 542*a* which can be increased or decreased depending upon the number, width, and length of the respective serpentine strips 542*a*2, 542*a*3, and 542*a*4.

Figure 18:
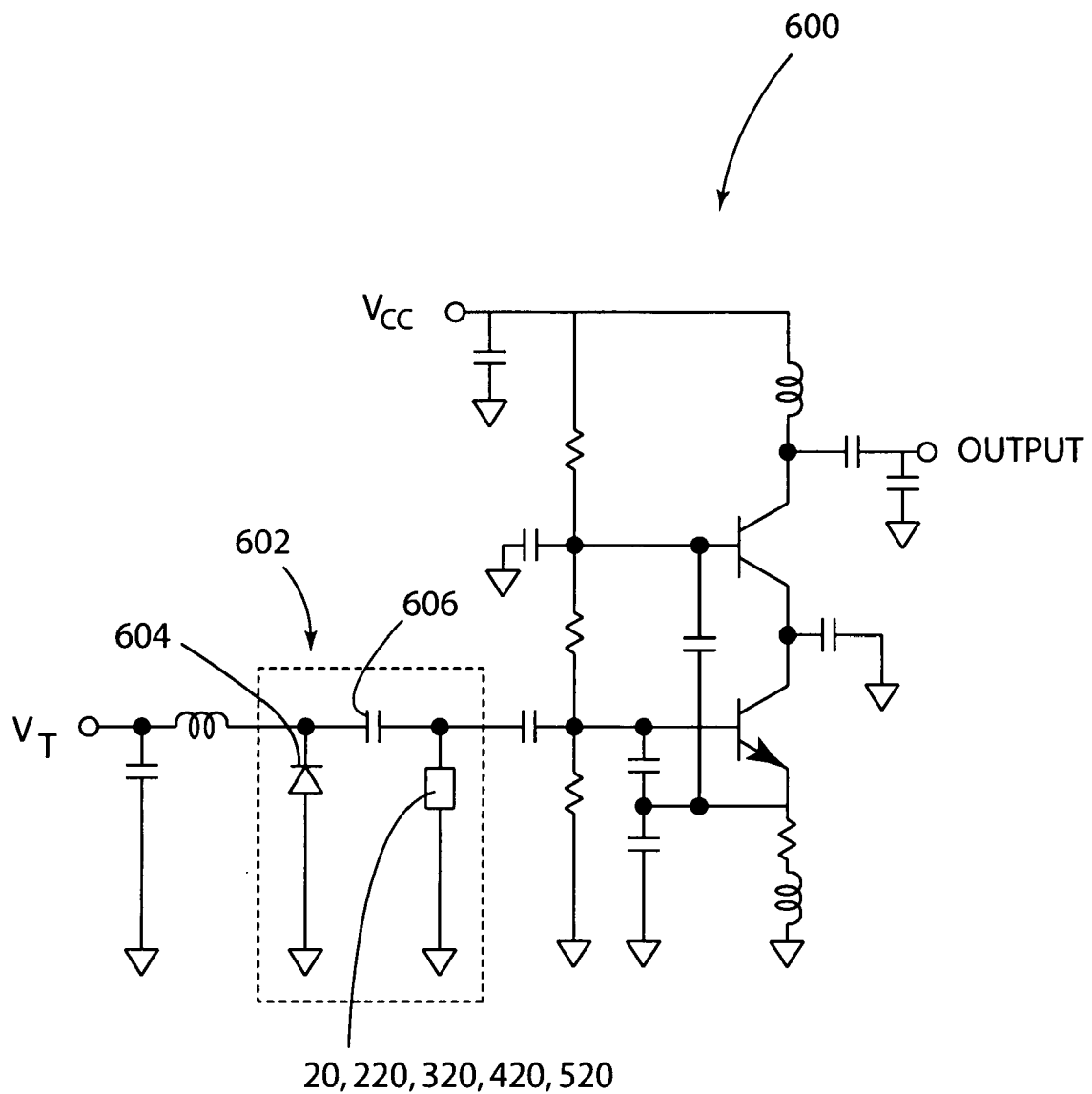
FIG. 18 is a simplified schematic of the circuit of a voltage controlled oscillator in which the ball grid array resonator of the present invention is adapted to be used and incorporated.

One of the preferred applications of each of the resonator embodiments described above is in a voltage controlled oscillator 600, a representative circuit of which is shown in FIG. 18 as incorporating a tank circuit 602 comprising a varactor 604 coupled between ground and circuit line 608; a capacitor 606, and any of the resonators 20, 220, 320, 420 or 520 of the present invention also coupled between circuit line 608 and ground. The varactor 604 and resonators are coupled in parallel and the capacitor is coupled in series therebetween.

More specifically, and as shown in FIG. 13, the tank circuit 602 is defined by a circuit line 608.

It is further understood, of course, that the oscillator circuit of FIG. 18 is but one illustrative embodiment of suitable oscillator and tank circuit configurations capable of defining a voltage controlled oscillator or VCO/PLL with performance characteristics in the 1.5-10 GHz range, using the resonator 20 or 220 of the present invention.

It is still further understood that numerous variations and modifications of the embodiments described above may be effected without departing from the spirit and scope of the novel features of the invention. No limitations with respect to the specific resonator structures illustrated herein are intended or should be inferred.

For example, it is understood that resonator performance is a function of a variety of factors such as: the length of the resonator strips; the width of the resonator strips; the shape of the resonator strips; the number of resonator strips; the location and relationship and position of the resonator strips relative to one another; the location and relationship between the respective signal and ground tap points on the respective strips; the value of the dielectric constant of the ceramic substrate material; the thickness of the ceramic substrate material; the length, diameter, location and/or number of vias extending through the substrate material; and the distance between the lid and substrate surface.

Thus, it is understood that the invention is not limited to the particular resonator and ground strip patterns depicted herein but also to any and all such variations of these patterns, vias, etc., which may be necessary for a particular application.

What is claimed is:

1. A ball grid array resonator comprising:
a ceramic substrate including opposed first and second surfaces defining opposed short side and long side edges;
a conductive resonator pattern on said first surface defined by first, second, and third strips of conductive material extending along the length of said substrate in spaced-apart and generally parallel relationship and a fourth strip of conductive material interconnecting said first, second, and third strips of conductive material and extending along the width of said substrate adjacent one of the short side edges of said substrate in a relationship generally transverse to said first, second, and third strips of conductive material;
a ground plane on said second surface defined by at least one strip of conductive material;
a plurality of conductive vias extending through said substrate in a relationship generally normal to said first and second surfaces and defining opposed ends terminating in one or more of said first, second, third, and fourth strips of conductive material on said first surface and said at least one strip on said second surface;
a plurality of first conductive balls overlying said ends of said conductive vias terminating in said first surface so as to define respective ground pads; and
at least a second conductive ball disposed over the end of one of said first, second, third, and fourth strips of conductive material on said first surface and defining an RF signal input/output pad, said first strip of conductive material being centrally disposed on said first surface between said opposed short side edges of said substrate and having a width which is less than the width of said fourth strip of conductive material on said first surface, said first strip of conductive material defining a first end unitary with and terminating in said fourth strip of conductive material adjacent the one of the short side edges of said substrate and an opposed end terminating at a point adjacent and spaced from the other of the short side edges of said substrate, one of said ends of said plurality of vias terminating in said fourth strip of conductive material and one of said plurality of first conductive balls being seated over said end of said one of said plurality of vias terminating in said fourth strip of conductive material, said second conductive ball being seated over the end of said first strip of conductive material opposite the end thereof which is unitary with said fourth strip of conductive material to define a path for RF signals through said first and fourth strips of conductive material.

2. A resonator comprising:
a substrate having a first surface defining at least a ground plane and a second surface defining at least a resonator pattern, said substrate defining first and second long side edges and first and second short side edges, the resonator pattern being defined by at least a first resonator strip extending along the length of said second surface between the first and second short side edges of said substrate;
at least one conductive via extending through said substrate and defining opposed ends terminating in said first and second surfaces respectively, said at least one conductive via defining opposed ends terminating in said first resonator strip and said ground plane respectively;

at least one ground pad defined on one or both of said first and second surfaces and in electrical contact with said at least one conductive via; and at least one RF signal input/output pad defined on one of said first and second surfaces, said at least one ground pad and RF signal input/output pad being defined by respective first and second solder spheres, said first solder sphere overlying an end of said at least one conductive via terminating in an end of said first resonator strip adjacent the first short side edge of said resonator and the second solder sphere being seated over an opposite end of said first resonator strip adjacent the second short side of said resonator;

the resonator pattern being further defined by at least a second resonator strip extending along the width of said second surface adjacent one of said first and second short sides of said substrate in a relationship generally normal to and unitary with one of the ends of said first resonator strip and a plurality of second vias define respective ends terminating in said second resonator strip and said ground plane respectively; and the resonator pattern being further defined by at least third and fourth resonator strips extending unitarily outwardly from opposed ends of said second resonator strip along and adjacent said first and second long sides of said substrate respectively and in a spaced-apart relationship to said first resonator strip, the resonator further comprising a plurality of third vias defining respective ends terminating in said third and fourth resonator strips and said ground plane respectively.

\* \* \* \* \*